United States Patent [19]

Noguchi et al.

[11] Patent Number: 5,585,221
[45] Date of Patent: Dec. 17, 1996

[54] ACTIVE ENERGY RAY-CURING RESIN COMPOSITION

[75] Inventors: Hiromichi Noguchi, Atsugi; Tadayoshi Inamoto, Machida; Megumi Munakata, Atugi, all of Japan

[73] Assignee: Canon Kabushiki Kaisha, Tokyo, Japan

[21] Appl. No.: 205,146

[22] Filed: Mar. 2, 1994

Related U.S. Application Data

[63] Continuation of Ser. No. 920,165, Jul. 27, 1992, abandoned, which is a continuation of Ser. No. 762,263, Sep. 20, 1991, abandoned, which is a continuation of Ser. No. 536,945, Jun. 12, 1990, abandoned, which is a continuation of Ser. No. 246,935, Sep. 19, 1988, abandoned, which is a continuation of Ser. No. 870,975, Jun. 5, 1986, abandoned.

[30] Foreign Application Priority Data

Jun. 10, 1985 [JP] Japan .................. 60-125717
Jun. 10, 1985 [JP] Japan .................. 60-125718
Jun. 18, 1985 [JP] Japan .................. 60-132492

[51] Int. Cl.$^6$ ........................... G03C 1/725
[52] U.S. Cl. .................. 430/280.1; 522/102; 522/149; 525/65; 525/92 B; 525/94; 525/118
[58] Field of Search .................. 522/102, 149; 430/280; 525/65, 92, 94, 118

[56] References Cited

U.S. PATENT DOCUMENTS

| | | | |
|---|---|---|---|
| 3,382,297 | 5/1968 | Thompson | 525/94 |
| 3,450,613 | 6/1969 | Steinberg | 522/103 |
| 3,607,977 | 9/1971 | Taylor | 525/94 |
| 3,655,826 | 4/1972 | Fellman et al. | 260/876 R |
| 3,711,575 | 1/1973 | Kakefuda et al. | 260/883 |
| 3,746,673 | 7/1973 | Simms | 525/65 |
| 3,764,324 | 10/1973 | Reyes | 522/102 |
| 3,793,398 | 2/1974 | Hokamura | 525/65 |
| 4,148,967 | 4/1979 | Satoh | 522/102 |
| 4,163,809 | 8/1979 | McGinniss | 522/102 |
| 4,181,581 | 1/1980 | Inata | 525/94 |
| 4,299,938 | 11/1981 | Green | 522/31 |
| 4,366,289 | 12/1982 | Keskkula | 525/94 |
| 4,394,670 | 7/1983 | Sugitani et al. | 346/140 R |
| 4,412,224 | 10/1983 | Sugitani | 346/1.1 |
| 4,417,251 | 11/1983 | Sugitani | 346/1.1 |
| 4,429,076 | 1/1984 | Saito | 525/94 |
| 4,437,100 | 3/1984 | Sugitani et al. | 346/1.1 |
| 4,509,063 | 4/1985 | Sugitani et al. | 346/140 |
| 4,521,787 | 6/1985 | Yokota et al. | 346/140 |
| 4,524,183 | 6/1985 | Weber | 525/118 |
| 4,533,975 | 8/1985 | Bill | 361/323 |
| 4,554,322 | 11/1985 | Kwiecinski | 525/245 |
| 4,593,067 | 6/1986 | Nakayama | 525/92 |
| 4,688,052 | 8/1987 | Inamoto et al. | 346/140 R |
| 4,688,053 | 8/1987 | Noguchi et al. | 346/140 R |
| 4,688,054 | 8/1987 | Inamoto et al. | 346/140 R |
| 4,688,055 | 8/1987 | Noguchi et al. | 346/140 R |
| 4,688,056 | 8/1987 | Noguchi et al. | 346/140 R |

FOREIGN PATENT DOCUMENTS

| | | |
|---|---|---|
| 2411753 | 10/1975 | Germany . |
| 2610437 | 9/1976 | Germany . |
| 47-47865 | 2/1972 | Japan . |
| 51-040451 | 11/1976 | Japan . |
| 52-043091 | 10/1977 | Japan . |
| 57-87409 | 5/1982 | Japan . |

*Primary Examiner*—Mark Chapman
*Attorney, Agent, or Firm*—Fitzpatrick, Cella, Harper & Scinto

[57] ABSTRACT

An active energy ray-curing resin composition comprises a graft copolymerized polymer and at least one of a monomer having an ethylenically unsaturated bond and a partially esterified epoxy resin.

14 Claims, No Drawings

ACTIVE ENERGY RAY-CURING RESIN COMPOSITION

This application is a continuation of application Ser. No. 07/920,165 filed Jul. 27, 1992, now abandoned, which is a continuation of application Ser. No. 07/762,263 filed Sep. 20, 1991, now abandoned, which is a continuation of application Ser. No. 07/536,945 filed Jun. 12, 1990, now abandoned, which is a continuation application Ser. No. 07/246,935 filed Sep. 19, 1988, now abandoned, which is a continuation of application Ser. No. 06/870,975 filed Jun. 5, 1986, now abandoned.

BACKGROUND OF THE INVENTION

1. Field of the Invention

This invention relates to a resin composition which can be cured by irradiation of an active energy ray, such as UV-ray, electron beam, etc., particularly to an active energy ray curing type resin composition which is excellent in adhesion to a substrate, such as glass, ceramics, plastic films, etc., chemical resistance and mechanical strength, also has high sensitivity and high resolution as the pattern forming material, and is suitable for formation of a pattern comprising a cured film of high density. The active energy ray curing type resin composition is a resin composition which can be formed into a solid photosensitive sheet (dry film).

2. Related Background Art

In recent years, active energy ray curing resins have been frequently used as coating materials, inks, sealing materials, resist materials, and pattern forming materials. Active energy ray-curing resins as pattern forming materials have been used for preparation of printing plates at the initial stage, but they have been recently utilized also for construction materials for precise instruments such as inkjet recording heads as disclosed in Japanese Laid-open Patent Application 43876/1982, in addition to having been utilized electronic industries such as print wirings, integrated circuits, etc.

However, among the active energy ray-curing resins used for pattern formation heretofore known, particularly among those of dry film type, there has been no resin excellent in adhesion to substrates such as glass, ceramics or plastic films, etc. On the other hand, those which are known as photocurable type coating materials or adhesives to be used for glass, metals, ceramics, etc. are excellent in adhesion, but irradiation of a strong active energy ray or prolonged irradiation is required, and yet they generally do not have suitable properties for pattern formation. Thus, even if it was attempted to obtain a pattern by irradiating an active energy ray in a pattern by use of these materials and removing the non-exposed portion by development, it was impossible to obtain a pattern of high precision and high resolution.

As described above, in the prior art, there has been no material which is capable of forming a precise pattern with excellent adhesion on various substrates, and which pattern has also high durability as the construction material.

SUMMARY OF THE INVENTION

An object of the present invention is to provide an active energy ray-curing resin composition which could not be accomplished by the active energy ray-curing resin of the prior art as described above, which is excellent in adhesion to a substrate not only when used as a liquid coating on a substrate but also when used in the form of dry film adhered onto a substrate, has also high sensitivity to an active energy ray and can form a precise and high resolution pattern.

Another object of the present invention is to provide an active energy ray-curing resin composition, which can be formed into a dry film convenient for formation of a pattern, and can also give a pattern formed by curing with irradiation of an active energy ray, and optional heating treatment, which is excellent in chemical resistance and mechanical strength, and also has high durability as the construction material.

According to the present invention, there is provided an active energy ray-curing resin composition comprising the component (i) shown below and at least one of the components (ii) and (iii) shown below:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from (A) hydroxyl containing acrylic monomers, (B) amino or alkylamino containing acrylic monomers, (C) carboxylic containing acrylic or vinyl monomers, (D) N-vinylpyrrolidone or its derivatives, (E) vinyl-pyridine or its derivatives and (F) acrylamide derivatives represented by the following formula I:

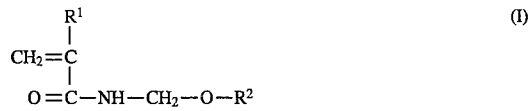

(wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have hydroxy group.), added to said trunk chain;

(ii) a monomer having an ethylenically unsaturated bond;

(iii) a resin comprising an epoxy resin comprising at least one compound having two or more epoxy groups in the molecule, the epoxy groups existing in said epoxy resin being partially esterified with an unsaturated carboxylic acid.

DESCRIPTION OF THE PREFERRED EMBODIMENTS

The graft copolymerized polymer (i) which is the essential component of the active energy ray-curing resin composition Of the present invention comprises a trunk chain having relatively rigid properties suitable for a structural material having graft chains composed mainly of the above monomers (A)–(F) having hydrophilic property and exhibiting excellent adhesion to the substrate added thereto.

In constituting the above graft copolymerized polymer, specific examples of the monomers (A)–(F) to be used for constitution of the graft chains are shown below. Examples of the acrylic monomer containing hydroxyl group(s) of (A) include 2-hydroxyethyl(meth)acrylate (hereinafter, (meth)acrylate means to include both acrylate and methacrylate), 2-hydroxypyropyl(meth)acrylate, 3-chloro-2-hydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, or monoester of 1,4-cyclohexanedimethanol with acrylic acid or methacrylic acid, including those obtained under the trade names of Aronix M5700 (produced by Toa Gosei Kagaku K. K.), TONE M100 (caprolactone acrylate produced by Union Carbide), Light Ester HO-mpp (produced by Kyoeisha Yushi Kagaku Kogyo K. K. ), Light Ester M-600A (trade name of 2-hydroxy-3-phenoxypropylacrylate, produced by Kyoeisha Yushi Kagaku Kogyo K. K. ), and also monoesters of divalent alcohols such as 1,10-decanediol, neopentylglycol, bis(2-hydroxyethyl)terephthalate, bisphenol A and addition products of ethylene oxide or propylene oxide with (meth-)acrylylic acid.

Examples of the amino or alkylamino containing acrylic monomer of (B) include (meth)acrylamide, N,N-dimethylaminoethyl(meth)acrylamide, N,N-dimethyl(meth)acrylamide, N,N-dimethylaminopropyl(meth)acrylamide, N,N-di-t-butylaminoethyl(meth)acrylamide and the like.

Examples of the carboxyl containing acrylic or vinyl monomer of (C) include (meth)acrylic acid, fumaric acid, itaconic acid or those known under the trade names of Aronix M-5400, Aronix M-5500, etc.

Examples of vinylpyridine or its derivatives of (E) include 2-vinylpyridine, 4-vinylpyridine, 2-vinyl-6-methylpyridine, 4-vinyl-1-methylpyridine, 2-vinyl-5-ethylpyridine, 4-(4-pipenilinoethyl)pyridine and the like.

The above monomers (A)–(E) all have hydrophilic properties and impart firm adhesion when the composition of the present invention is adhered to a substrate such as glass, ceramics, plastic, etc.

Examples of the acrylamide derivative represented by the formula I of (F) include monomers having hydrophilic property and also heat cross-linkability such as N-methylol(meth)acrylamide, N-propoxymethyl(meth)acrylamide, N-n-butoxymethyl(meth)acrylamide, β-hydroxyethoxymethyl(meth)acrylamide, N-ethoxymethyl(meth)acrylamide, N-methoxymethyl(meth)acrylamide, α-hydroxymethyl-N-methylolacrylamide, α-hydroxyethyl-N-butoxymethylacrylamide, α-hydroxypropyl-N -propoxymethylacrylamide, α-ethyl-N-methylolacrylamide, α-propyl-N-methylolacrylamide and the like. These monomers (F) have hydrophilic property as a matter of course, and also condensing crosslinkability by heating, and will generally form crosslinked bonds by elimination of water molecules or alcohol at a temperature of 100° C. or higher, thereby to form a network structure also in the graft copolymerized polymer itself after curing, whereby the pattern obtained by curing can be further improved in chemical resistance and mechanical strength, etc., to make the present invention more effective.

Also, to the above monomers (A)–(F), monomer which can be crosslinked by ring opening by heat such as glycidyl-(meth)acrylate may be partially added to constitute the graft chains, whereby the same effect as in the above (F) can be obtained.

In addition to the above thermal crosslinking, for the same purpose, it is also effective to crosslink the graft copolymerized polymer with an active energy ray by introducing a photopolymerizable monomer into a part of the graft chains of the graft copolymer in the present invention. As the method for imparting photopolymerizability to the graft chain, there may be employed for example, ⓘ the method in which a carboxyl containing monomer exemplified by (meth)acrylic acid, etc., or an amino or tertiary amine containing monomer is copolymerized, followed by the reaction with glycidyl(meth)acrylate, etc.;

ⓙ the method in which a partial urethane compound of polyisocyanate having one isocyanate group and one or more acrylic ester groups in one molecule is reacted with the hydroxyl group, amino group or carboxyl group in the graft chain;

ⓚ the method in which acrylic acid chloride is reacted with the hydroxyl groups in the graft chain;

ⓛ the method in which an acid anhydride is reacted with the hydroxyl group in the graft chain, followed by the reaction with glycidyl(meth)acrylate;

ⓜ the method in which the hydroxyl group in the graft chain is condensed with the condensing cross-linkable monomer as exemplified in (F), thereby leaving acrylamide group in the side chain;

ⓝ the method in which the hydroxyl group in the graft chain is reacted with glycidyl(meth)acrylate; etc.

When the graft chain of the graft copolymerized polymer in the present invention is heat cross-linkable, it is preferable to perform heating after formation of a pattern by irradiation of an active energy ray. On the other hand, also when the above graft chain is photopolymerizable, there is no problem in performing heating within the range permissible with respect to the heat resistance of the substrate, and rather preferable results can be obtained by heating.

The graft chains are not limited to those derived only from the hydrophilic monomers as exemplified by the above (A)–(F), but the graft chains may also contain various hydrophobic monomers which can exhibit various other functions as the copolymer component within the range of 0 to about 25 weight %.

The monomer constituting the trunk chain of the graft copolymerized polymer in the present invention is an alkyl methacrylate having 1 to 4 carbon atoms in the alkyl group such as methyl methacrylate, ethyl methacrylate, isobutyl methacrylate, t-butyl methacrylate, etc., acrylonitrile and styrene.

The trunk chain is not limited to those derived from only the above monomers, but it may be also a trunk chain using other monomers such as methyl acrylate, ethyl acrylate, n-butyl acrylate, lauryl acrylate, n-butyl methacrylate, 2-ethylhexyl methacrylate, glycidyl methacrylate, vinyl acetate, etc., as the copolymer component within the range of 0 to about 50 weight %.

In the composition of the present invention, the above trunk chain gives high cohesive strength to the composition. The composition of the present invention can be provided in various shapes depending on the purpose of use such as solutions or solid films, etc. However, when it is used as a dry film, it is preferable to use a relatively rigid trunk chain having a glass transition temperature of about 50° C. or higher in order to maintain the composition in the shape of a film. In this application, the trunk chain to be used may be constituted of two or more kinds having different glass transition temperatures. On the other hand, when the composition of the present invention is to be used as a solution, it is possible to use a trunk chain having a low glass transition temperature so as to give the composition flexibility. However, also in this case, in order to obtain a pattern having excellent chemical resistance and high mechanical strength, it is preferable to use a trunk chain having a high glass transition temperature.

The graft copolymerized polymers to be used in the present invention may be classified broadly into those having no curability, those having photopolymerizability and those having heat crosslinkability. In either case, the graft copolymerized polymer enables precise patterning by imparting form maintaining property to the composition in the curing steps (namely active energy ray irradiation and optional heat curing) of the composition of the present invention, and also gives excellent adhesiveness, chemical resistance as well as high mechanical strength to the pattern obtained by curing.

The above graft copolymerized polymer to be used in the composition of the present invention can be prepared according to known methods, specifically by various methods as disclosed in "Base and Application of Polymer Alloy" p. 10–35 (edited by Polymer Society of Japan, published by Tokyo Kagaku Dojin K. K. , 1981). Examples of those methods include ① the chain transfer method, ② the method by use of radiation, ③ the oxidation polymerization method, ④ the ion graft polymerization method and ⑤ macromonomer method. For the graft copolymer to be used in the present invention, since the surface active effect is marked when the length of the graft chains are uniform, it is preferable to use the method of ④ and ⑤, particularly preferably the macromonomer method of ⑤ which is advantageous in design of materials. The graft copolymer should preferably have a weight-average molecular weight of about 5000 to 300000 and, when used as a dry films preferably about 30000 to 300000.

The monomer (ii) having an ethylenically unsaturated bond to be used in the resin composition of the present invention is a component for permitting the resin composition of the present invention to exhibit curability with an active energy ray, particularly imparting excellent sensitivity to an active energy ray to the resin composition of the present invention, preferably having a boiling point of 100° C. or higher under atmospheric pressure, having two or more ethylenically unsaturated bonds, and various known monomers curable by irradiation of an active energy ray can be used.

Specific examples of such monomers having two or more ethylenically unsaturated bonds include ⓐ acrylic acid esters or methacrylic acid esters of polyfunctional epoxy resins having two or more epoxy groups in one molecule, ⓑ acrylic acid esters or methacrylic acid esters of alkyleneoxide addition products of polyhydric alcohols, ⓒ polyester acrylates having acrylic acid ester group at the terminal ends of the molecular chains of polyesters having molecular weights of 500 to 3000 comprising dibasic acid and dihydric alcohol, ⓓ the reaction products between polyisocyanates and acrylic acid monomers having hydroxyl groups. The above monomers ⓐ–ⓓ may be urethane-modified products having
urethane bonds in the molecules.

Examples of the monomers belonging to ⓐ include acrylic acid or methacrylic acid esters of polyfunctional epoxy resins to be used for formation of the resin component (half-esterified epoxy resin) for the resin component (iii) which becomes one of the components in the resin composition of the present invention as hereinafter described.

Examples of the monomers belonging to ⓑ include ethyleneglycol di(meth)acrylate, diethyleneglycol (meth)acrylate, polyethyleneglycol di(meth)acrylate, 1,6-hexanediol (meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K. K. ), and also those known under the trade names of NK ester BPE-200, BPE-500, BPE-1300, A-BPE-4 (all produced by Shin Nakamura Kagaku K. K. ). etc., may also be available.

The monomers belonging to ⓒ may be exemplified by those known under the trade names of Aronix M-6100, M-6200, M-6250, M-6300, M-6400, M-7100, M-8030, M-8060, M-8100 (all produced by Toa Gosei Kagaku K. K. ). Examples of the monomers belonging to ⓑ and having urethane bonds of polyester include those known under the trade names of Aronix M-1100, Aronix M-1200, (both produced by Toa Gosei Kagaku K. K. ).

The monomers belonging to ⓓ may include the reaction products between polyisocyanate, such as tolylene diisocyanate, isophorone diisocyanate, hexamethylene diisocyanate, trimethylhexamethylene diisocyanate, lysine diisocyanate, diphenylmethane diisocyanate or the like, with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K. K.), etc. The hydroxyl containing acrylic monomer as herein mentioned may include typically (meth)acrylic acid esters, preferably hydroxyethyl acrylate, hydroxyethyl methacrylate, hydroxypropyl acrylate. It is also possible to use other acrylic monomers containing hydroxyl group(s) mentioned in the present specification as useful for the graft chains in the graft copolymerized polymer.

In addition to the monomers having two or more ethylenically unsaturated bonds as mentioned above, it is also possible to use monomers having only one ethylenically unsaturated bond as mentioned below together with these monomers. To exemplify such monomers-having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

Anyway, by use of the above monomer having ethylenically unsaturated bonds, high sensitivity and satisfactory curability to an active energy ray can be imparted to the composition of the present invention.

The resin component (iii) obtained by esterifying a part of the epoxy groups existing in the epoxy resin comprising one or more compounds, having two or more epoxy groups in one molecule, with an unsaturated carboxylic acid to be used in the present invention (hereinafter abbreviated as half-esterified epoxy resin) is a component which permits the composition of the present invention to exhibit curability with an active energy ray similarly with the monomer (ii)

having ethylenically unsaturated bonds as described above or together with the monomer (ii) and, in addition thereto, imparts better adhesiveness with a substrate, water resistance, chemical resistance, dimensional stability, etc., to the cured film formed by coating the resin composition of the present invention in liquid state on various substrates comprising glass, plastics, ceramics, etc., followed by curing, or to the cured film formed by adhering the resin composition in the form of a dry film on various substrates.

The half-esterified epoxy resin (iii) to be contained in the resin composition of the present invention can be obtained by, for example, reacting an epoxy resin with a predetermined amount of an unsaturated carboxylic acid in the co-presence of an addition catalyst and a polymerization inhibitor, in the presence or absence of a solvent, under the temperature condition of 80° to 120° C., thereby esterifying a part of the epoxy groups existing in the epoxy resin with the carboxylic acid.

Examples of the epoxy resin comprising one or more compounds containing 2 or more epoxy groups in one molecule which can be used for formation of the half-esterified epoxy resin (iii) include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula II:

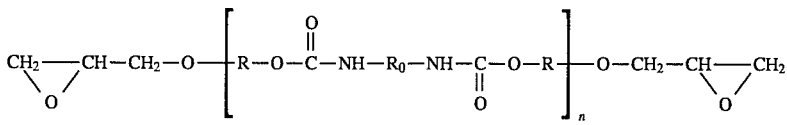

(wherein R represents an alkyl group or an oxyalkyl group, $R_0$ represents

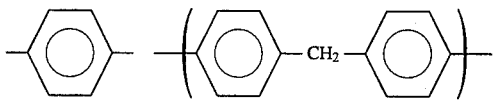

or an alkyl group), and mixtures of at least one of these.

Specific examples of these polyfunctional epoxy resins include those as mentioned below. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.) and Epicrone 800 (trade name, produced by Dainippon Ink Kagaku Kogyo K. K.), etc. The novolac type epoxy resin may be, for example, Epicoat 152, 154, 172 ( trade names, produced by Shell Chemical Co.), Allaldite EPN 1138 (trade name, produced by Ciba Geigy Co.), DER 431, 438 and 439 (trade names, produced by Dow Chemical Co.), etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.), etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentyl-glycol diglycidyl ether, etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkyleneoxide, a diglycidyl ether of an addition product of bisphenol S added with 2 to 16 mols of alkyleneoxide.

While various unsaturated carboxylic acids can be used for half-esterification of the epoxy resin, it is preferable for imparting better curability with an activation energy to the resin composition of the present invention to use a monobasic unsaturated carboxylic acid having an acrylic or methacrylic vinyl group on at least one terminal end of the molecule and a carboxyl group on the other terminal end.

Typical examples of such unsaturated carboxylic acids may include acrylic acid and methacrylic acid, and it is also possible to use a monoester compound obtained by the reaction between a dicarboxylic acid and a (meth)acrylic acid ester having one hydroxyl group.

The above dicarboxylic acid may include phthalic acid, isophthalic acid, terephthalic acid, oxalic acid, malonic acid, succinic acid, glutaric acid, adipic acid, pimelic acid, suberic acid, azelaic acid, sebacic acid, isosebacic acid, tetrahydrophthalic acid and anhydrydes thereof.

The above (meth)acrylic acid ester having one hydroxyl group may include, 2-hydroxypropyl (meth)acrylate, 3-chloro-2-hydroxypropyl (meth)acrylate, 4-hydroxybutyl (meth)acrylate, 3-hydroxybutyl (meth)acrylate, 5-hydroxypentyl (meth)acrylate and 6-hydroxyhexyl (meth)acrylate and the like.

Examples of the addition reaction catalyst which can be used for half-esterification reaction of epoxy resin include metal halides such as zinc chloride, lithium chloride or the like; sulfide compounds such as dimethyl sulfide, methylphenyl sulfide or the like; sulfoxide compounds such as dimethyl sulfoxide, methylethylsulfoxide or the like; tertiary amine compounds such as N,N-dimethylaniline, pyridine, triethylamine, benzyldimethylamine or the like, and their hydrochlorides or hydrobromides; quaternary ammonium salts such as tetramethylammonium chloride, trimethyldodecylbenzylammonium chloride, triethylbenzylammonium chloride or the like; sulfonic acid compounds such as p-toluene sulfonic acid; and mercaptan compounds such as ethylmercaptan, propylmercaptan or the like.

Further, examples of the polymerization inhibitor which can be used for half-esterification include hydroquinone, alkyl or aryl-substituted hydroquinone, tertiary butylcatechol, pyrogallol, naphthylamine, β-naphthol, cuprous chloride, 2,6-di-tert-butyl-p-cresol, phenothiazine, pyridine, N-nitrosodiphenylamine and nitrobenzene.

The solvent which can be used when carrying out half-esterification in the presence of a solvent may include toluene, xylene, methyl isobutyl ketone, methyl ethyl ketone, ethyl acetate, butyl acetate and isobutyl acetate, etc.

The amounts of the epoxy resin and the unsaturated carboxylic acid used during half-esterification may be suitably selected so that the ratio of the epoxy groups in the epoxy resin to the carboxy groups in the unsaturated carboxylic acid may preferably 1: 0.2 to 1 : 0.7, more preferably 1 : 0.2 to 1 : 0.55.

Thus, if the esterification ratio of the epoxy groups with the unsaturated carboxylic acid in the half-esterified epoxy resin is higher than the above range, good chemical resistance or dimensional stability derived from the epoxy resin cannot be effectively exhibited in the resin composition of the present invention. On the contrary, if the esterification ratio is lower than the above range, pattern forming characteristics, when using the resin composition of the present invention for formation of a pattern comprising a cured film, will be worsened. To describe in more detail, even if the monomer having ethylenically unsaturated bonds as mentioned above may be used to an extent which does not impair the characteristic of the cured film, in other words, in the increased amount possible within the range shown in the present invention, polymerization degree in polymerization by pattern exposure is low thereby yielding only a product with low contrast in solubility in the developer, with the result that no sharpness can be obtained at the outline portion of the pattern and the working conditions for obtaining a sharp pattern become extremely narrow.

As described above, the active energy ray-curing resin composition of the present invention, in addition to having the high sensitivity and satisfactory curability to the active energy ray based on unsaturated double bonds possessed by the monomer (ii) having ethylenically unsaturated bonds and/or the half-esterified epoxy resin (iii) contained as the components, has also heat curability based on the epoxy groups possessed by the half-esterified epoxy resin (iii) when containing the half-esterified epoxy resin (iii). For example, a cured film obtained by curing by irradiation of an active energy ray on the resin composition of the present invention, followed by further heat curing by heating at 80° C. or higher for about 10 minutes to 3 hours, can be further endowed with good adhesiveness with the substrate, chemical resistance, dimensional stability, etc., derived from the epoxy resin.

The active energy ray to be used for curing of the active energy ray-curing resin composition of the present invention may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

The active energy ray-curing resin composition of the present invention can be cured by the active energy ray as described above, and it is preferable to add thereto a radical polymerization initiator capable of forming organic free radicals which can be activated by the action of an active energy ray in the resin composition when employing an active energy ray with a wavelength of 250 nm to 450 nm. As the radical polymerization initiator, known substances having the property of being activated with an active energy ray, forming organic free radicals and initiating radial polymerization can be used without any particular limitation.

Specific examples of such radical polymerization initiators include benzyl, benzil alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis(N,N-diethylamino)benzophenone, benzophenone methyl ether and the like; anthraquinones such as 2-ethylanthraquinone, 2- t-butylanthraquinone and the like; xanthones such as 2,4-dimethylthioxanthone, 2,4-diisopropylthioxanthone and the like; acetophenones such as 2,2-dimethoxy-2-phenylacetophenone, α, α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irgacure 184, produced by Ciba Geigy Co.), 1-(4-isopropylphenyl)-2-hydroxy-2-methylpropane-1-one (e.g. Darocure 1116, produced by MERCK Co.), 2-hydroxy-2-methyl-1-phenylpropane-1-one (Darocure 1173, produced by MERCK CO.); etc., as preferable ones. In addition to these radical polymerication initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamylester, etc.

Further, in the active energy ray-curing resin composition of the present invention, in order that the epoxy groups possessed by the half-esterified epoxy resin (iii) can be also photopolymerized by the action of the active energy ray, there can be formulated aromatic onium salt compounds having photosensitivity containing an element belonging to group VIa as shown in Japanese Patent Publication No. 14278/1977 or aromatic onium salt compounds having photosensitivity containing an element belonging to group Va as shown in Japanese Patent Publication No. 14279/1977.

The aromatic onium salt compounds having photosensitivity of the element belonging to group VIa or the group Va may include typically the compounds of the following formula III:

$$[(R)_a(R^1)_b(R^2)_cX]_d{}^+[MQ_e]^{-(e-f)} \qquad (\text{III})$$

(wherein R is a monovalent organic aromatic group, R$^1$ is a monovalent organic aliphatic group selected from alkyl groups, dicycloalkyl groups and substituted alkyl groups, R$^2$ is a polyvalent organic group for constituting heterocyclic or fused ring structures selected from aliphatic groups and aromatic groups, X is an element belonging to group VIa selected from sulfur, selenium and tellurium or an element belonging to group Va selected from nitrogen, phosphorus, arsenic, antimony and bismuth, M is a metal or metalloid and Q is a halogen atom, a is an integer of 0 to 3 when X is an element belonging to group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to group Va, f is an integer of 2 to 7 representing the valence of M, e is an integer which is greater than f but not more than 8, and the sum of a, b and c is 3 when X is an element belonging to group VIa or 4 when X is an element belonging to group Va, and d=e−f). These compounds have the characteristic that the onium salt will release a Lewis acid by irradiation of light on these compounds, which acid cures the epoxy resin.

Specific examples of the photosensitive aromatic onium salt compounds containing an element belonging to group VIa or group Va which can be formulated in the resin composition of the present invention may include the photosensitive aromatic onium salts of the elements belonging to group VIa as shown below:

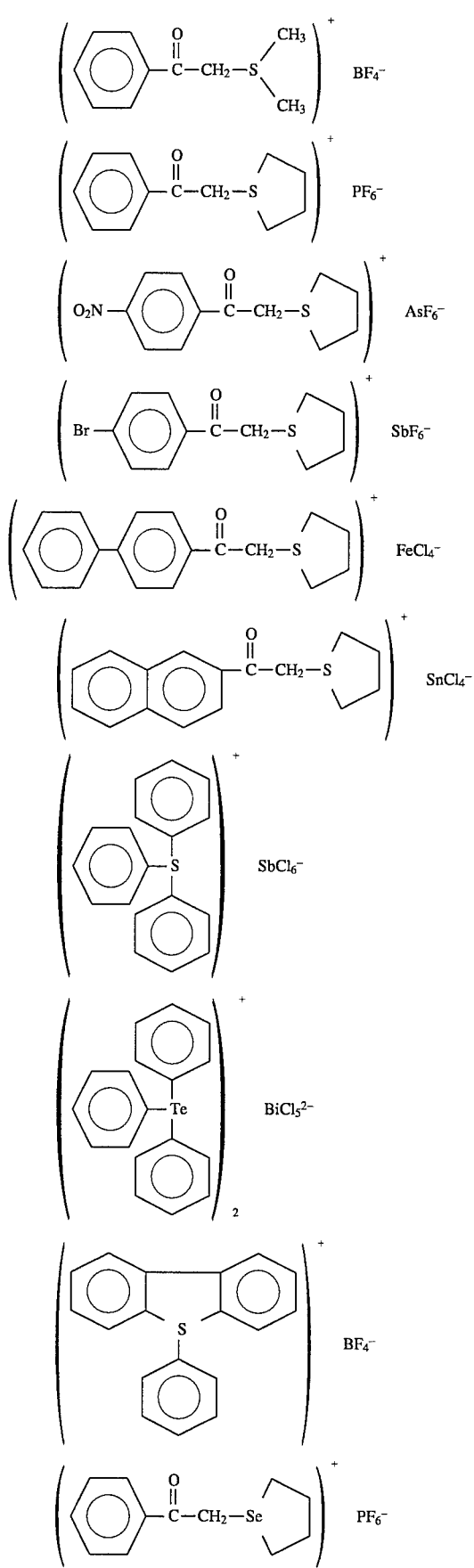
and photosensitive aromatic onium salts of the elements belonging to group VIa as shown below:
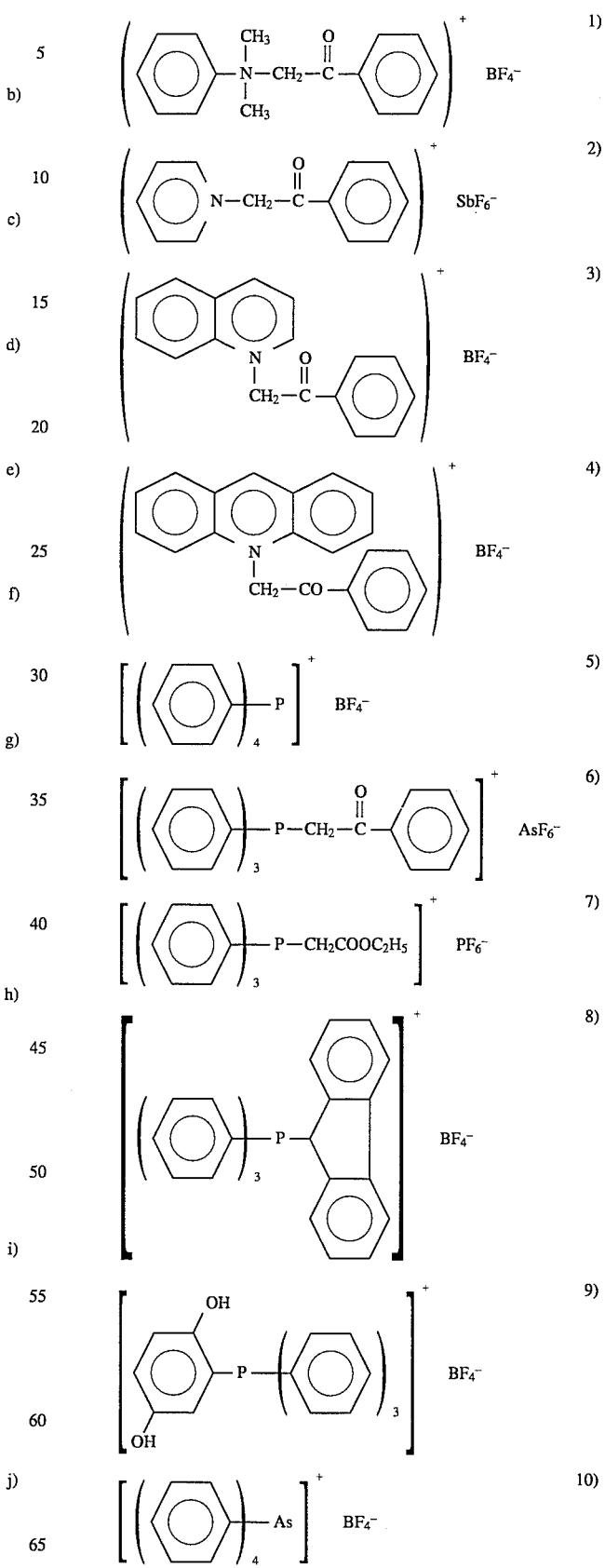

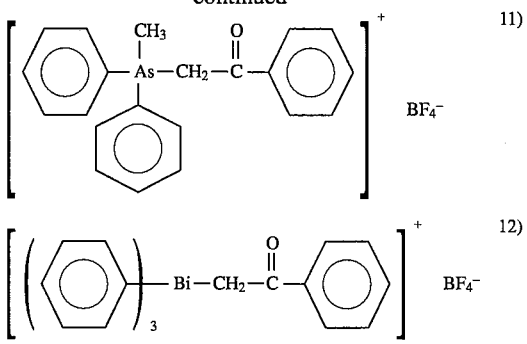

The constitutional ratio of the above materials constituting the active energy ray-curing resin composition of the present invention may be made 20 to 80 parts by weight, preferably 20 to 50 parts by weight for the graft copolymerized polymer (i) and 80 to 20 parts by weight, preferably 80 to 50 parts by weight for the total of the monomer having ethylenically unsaturated bonds (ii) and the half-esterified epoxy resin (iii) [(i)+(ii)+(iii)=100 parts by weight, this formula representing also the case when either (ii) or (iii) is 0].

When the resin composition of the present invention contains both the monomer having ethylenically unsaturated bonds (ii) and the half-esterified epoxy resin (iii), it is preferable that the content ratio of both components in the resin composition of the present invention be 30 : 70 to 70 : 30, in order to exhibit effectively the characteristics of both components.

More specifically, the half-esterified epoxy resin (iii) is effective for imparting the physical properties of the cured film such as adhesiveness, chemical resistance and dimensional stability to the excellent physical properties of the epoxy resin cured film, while the monomer having ethylenically unsaturated bonds (ii) is effective for imparting high sensitivity to an activation energy to the resin composition, respectively. If the content ratio of the components (ii) and (iii) is within the range as specified above, a resin composition and a cured film from the composition endowed with the properties of both components can be obtained. In contrast, if the content of the half-esterified epoxy resin (iii) is higher than the above range, the content of the component participating directly in curability to the active energy ray in the resin composition is not sufficient, whereby in the case of pattern formation, polymerization degree in polymerization by pattern exposure becomes lower, with the result that no sharpness can be obtained at the outline portion of the pattern, and also the working conditions for obtaining a sharp pattern become extremely narrow. Further, when the content of the half-esterified epoxy resin (iii) is lower than the above range, the content of the epoxy groups in the resin composition becomes smaller, with the result that polymerization reaction by heating after exposure can be with difficult, whereby excellent characteristics such as adhesion to the substrate, chemical resistance, dimensional stability, etc., cannot be fully exhibited.

When a radical polymerization initiator capable of being activated by the action of an activation energy ray is used in the resin composition of the present invention, the polymerization initiator may be used in an amount within the range from 0.1 to 20 parts by weight, preferably from 1 to 10 parts by weight based on 100 parts by weight of the resin components comprising the graft copolymerized polymer and the monomer having ethylenically unsaturated bonds and/or the half-esterified epoxy resin [(i)+(ii) or (i)+(iii) or (i)+(ii)+(iii)].

When a photosensitive aromatic onium salt containing an element belong to group VIa or group Va is used, the content of the compound may be 0.2 to 15 parts by weight, preferably 0.5 to 10 parts by weight based on 100 parts by weight of the resin components comprising the graft copolymerized polymer and the monomer having ethylenically unsaturated bonds and/or the half esterified epoxy resin [(i)+(ii) or (i)+(iii) or (i)+(ii)+(iii)].

As the solvent to be used when employing the active energy ray-curing resin composition of the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the composition of the present invention.

The active energy ray-curing resin composition of the present invention may further contain in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission of the active energy ray. As the filler, for enhancement of coating hardness, as well as for enhancement of coloration, adhesion, and mechanical strength, there may be employed extender pigments, plastic fine particles, etc., which are used in coating materials in general. As the adhesion promotor, silane coupling agents, and low molecular weight surfactants as inorganic surface modifiers may be effectively used in the composition of the present invention.

Also, in the active energy ray-curing resin composition of the present invention, curing agents for epoxy resins may be added, if desired. The curing agents for epoxy resin which can be added in the resin composition of the present invention may include, for example, polyamines, polyamides, acid anhydrides, boron trifluoride-amine complex, dicyandiamide, imidazoles, complexs of imidazole and metal salts.

The active energy ray-curing resin composition of the present invention can be used for protective coating of glass, adhesive, insulating layer of liquid crystal display devices, or surface modification such as transparent coloration or opaque coloration on glass plate, imparting water proofness, water repellency, anti-stain property, etc. Also, by making available excellent chemical resistance, it is useful as the masking material for glass etching or metallizing such as electroless copper plating, etc., solder mask for print wiring plate, etc. It is also useful for formation of minute liquid pathways, cooling pathways or nozzles utilizing water resistance, particularly for formation of nozzles in inkjet recording heads. Further, it is possible to obtain a photosensitive liquid or dry film for screen printing which can be used for both aqueous and oily inks having high durability incomparable with other materials.

When the active energy ray-curing resin composition of the present invention is provided for various uses as mentioned above, it can be used according to the methods as exemplified below.

1) The composition of the present invention is applied on a substrate to a desired thickness within the range from 1 to 100 μm, the solvent is dried by evaporation and then an active energy ray is irradiated. Then, the substrate is heated at 80° C. or higher for about 10 minutes to 3 hours. When a heat curable graft copolymerized polymer is employed, the heat treatment temperature is made at least 100° C. and the treatment is carried out for about 5 to 60 minutes.

2) The composition of the present invention is applied on a substrate to a desired thickness of 1 to 100 μm, followed by drying by evaporation of the solvent. Subsequently, a mask pattern with a transmittance of the active energy ray of at least 1% or less is closely contacted on the composition, and an active energy ray is irradiated from above the mask. Then, development is effected with a developer capable of dissolving the composition to remove the nonirradiated portion. Then, the substrate is heated at a temperature of at least 80° C. for about 10 minutes to 3 hours. When a heat curable graft copolymerized polymer is used, the treatment temperature is made at least 100 ° C. and treatment is carried out for about 5 to 60 minutes.

The cured film obtained as described above is excellent in resolution as a matter of course, and also in adhesion to the substrate, mechanical strength, water resistance, chemical resistance and dimensional stability.

The active energy ray-curing resin composition of the present invention can be also formed into a dry film, which is adhered to a substrate and then exposure and heating treatment is applied as described above whereby a cured film of the resin composition or a pattern comprising the cured film can be obtained on the substrate. Also in this case, it is possible to obtain a cured film excellent in adhesion to the substrate, mechanical strength, water resistance, chemical resistance and dimensional stability.

The active energy ray-curing resin composition of the present invention has very excellent sensitivity and resolution to an active energy ray as a pattern forming material imparted primarily by the monomer having ethylenically unsaturated bonds and/or the half-esterified epoxy resin as the components, and a high density and high resolution pattern can be formed by use thereof.

Moreover, the active energy ray-curing resin composition of the present invention has also the characteristics of the graft copolymerized polymer and the half-esterified epoxy resin as the components effectively exhibited, namely having excellent chemical resistance and dimensional stability imparted primarily by the half-esterified epoxy resin in addition to excellent adhesion to the substrate and mechanical strength imparted primarily by the graft copolymerized polymer, and the pattern formed by the composition has these excellent properties when viewed as the coating material, which is suitable for protective coating or structural material for which a long term durability is demanded.

Also, when a graft copolymerized polymer having curability is used, it is possible to obtain an active energy ray-curing resin composition which is further excellent in adhesiveness, mechanical strength and chemical resistance as mentioned above.

The present invention is described in more detail by referring to the following examples.

EXAMPLE 1

A living polymer (2-hydroxyethyl methacrylate/butyl acrylate=80/20 weight ratio) obtained by anion polymerization was allowed to react with p-vinylbenzylchloride to obtain a macromonomer (p-vinylbenzylpoly-2-hydroxyethyl methacrylate/butyl acrylate) with a weight-average molecular weight of about 1800 having a vinyl group at one terminal end of the molecular chain. Solution polymerization of 30 parts by weight of the macromonomer and 70 parts by weight of methyl methacrylate in methyl cellosolve gave a thermoplastic graft copolymerized polymer having a weight-average molecular weight of $7.0 \times 10^4$ (this is called GP-1). The polymethyl methacrylate chain constituting the main chain of the GP-1 has a glass transition point of 100° C.

On the other hand, Epikote 828 having an epoxy equivalent of about 190 (produced by Shell Chemical) was dissolved in a solvent mixture of 50% toluene and 50% butyl acetate to prepare a 30% solution. An amount of 0.5 equivalents of methacrylic acid relative to the existing epoxy groups was added and 0.2% based on the solid component of N-nitrosodiphenylamine was added as the polymerization inhibitor, followed by addition of 0.5% based on the solid components of LiCl as the catalyst. The reaction was carried out at 70° to 80 ° C. for 5 hours. Thus, an epoxy resin of which 0.5 equivalents of the 1.0 equivalent of epoxy groups were esterified with methacrylic acid, namely a half-esterified epoxy resin was obtained. The half-esterified epoxy resin obtained here is called HE-1.

By use of the HE-1 and the above GP-1, an active energy ray-curing resin composition was prepared as follows.

| | |
|---|---|
| GP-1 | 100 parts by weight |
| HE-1 | 100 parts by weight |
| Boron trifluoride monoethylamine | 10 parts by weight |
| Benzophenone | 10 parts by weight |
| Michler's ketone | 5 parts by weight |
| Crystal Violet | 0.3 parts by weight |
| Methyl cellosolve | 350 parts by weight |

The composition was applied by a bar coater on a 10 cm×10 cm Pyrex substrate which had been subjected to sonication cleaning treatment in a washing liquid Difreon (produced by Daikin Kogyo K. K.) and dried to a thickness of about 50 μm after drying.

In the surface of this composition was laminated a polyethyleneterephthalate film (Lumilar T type) with a thickness of 16 μm. Then, by use of a mask for resolution test, exposure was effected by means of a exposure light source for semiconductor "Mask Alignment Device MA-10" (produced by Mikasa K. K.) using a ultra-high pressure mercury lamp with the center wavelength in the vicinity of 365 nm and a light energy of 12 mW/cm$^2$ at the irradiated surface for 60 seconds. After exposure, development was practiced in the sonication cleaning machine with the use of a developer of 1,1,1-trichloroethane/ethanol (=80/20) for 45 seconds. The resolution of the resin composition after development was found to reproduce accurately the line/interval patterns with 50 μm widths.

Next, the substrate was dried by heating and post exposure of 10 J/cm$^2$ was practiced, followed by heating at 150° C. for 30 minutes. For the substrate, the cross-cut tape peel-off test was practiced with the use of industrial cellophane tape. As a result, 100/100 adhesiveness was exhibited, with complete adhesion except for the clear scars of the crosscuts.

Also, the substrate was dipped in an NaOH aqueous solution of pH=9.0, and the pressure cooker test was practiced under the conditions of 121° C., 2 atm, and 10 hours. After the pressure cooker test, the cross-cut tape peel-off test and the peel-off test at the 50 μm pattern portion were practiced again. As a result, in either test no lowering in adhesiveness such as peel-off, rising, etc., was seen at all. Also, no denaturation such as whitening of the coating was recognized at all.

EXAMPLE 2

A living polymer (N-methylolmethacrylamide/2-hydroxyethylmethacrylate =30/70 weight ratio) obtained by anion polymerization was allowed to react with p-vinylbenzylchloride to obtain a macromonomer (p-vinylbenzyl poly-N-methylolmethacrylamide/2-hydroxyethyl methacrylate) with a weight-average molecular weight of about 1500 having a vinyl group at one terminal end of the molecular chain.

Solution polymerization of 30 parts by weight of the macromonomer with a molecular weight of about 1500 and 70 parts by weight of methyl methacrylate in methyl cellosolve gave a thermoplastic graft copolymerized polymer having a weight-average molecular weight of $7.7 \times 10^4$ (this is called GP-2). The polymethyl methacrylate chain constituting the main chain of the GP-2 has a glass transition point of 100° C. By use of the GP-2 and the HE-1 obtained in Example 1, an active energy ray-curing resin composition having the following composition was prepared.

| GP-2 | 100 parts by weight |
| HE-1 | 100 parts by weight |
| Triphenylsulfonium tetrafluoroborate | 10 parts by weight |
| P-toluenesulfonic acid | 2 parts by weight |
| Crystal violet | 0.3 parts by weight |
| Methyl cellosolve | 350 parts by weight |

By use of the composition, a pattern of 50 μm lines and intervals with a thickness of 40 μm was formed on a 10 cm×10 cm Pyrex substrate in the same manner as Example 1. After evaporation of the developer, post-exposure was practiced for 10 minutes by use of the same light source. Subsequently, heat treatment was practiced at 150° C. for 30 minutes.

The substrate having the cured pattern thus formed was dipped in an NaOH aqueous solution of pH=9.0, and the pressure cooker test was practiced under the conditions of 121° C., 2 atm, and 20 hours. After the pressure cooker test, the cross cut tape peel-off test and the peel-off test at the 50 μm pattern portion were practiced. As a result, adhesion was found to be 100/100, without peel-off at the pattern portion.

EXAMPLE 3

A living polymer (3-chloro-2-hydroxypropyl methacrylate/N-vinylpyrrolidone (=90/10 molar ratio) obtained by anion polymerization was allowed to react with acrylic acid chloride to obtain a macromonomer (acrylic acid poly-3-chloro-2-hydroxypropyl methacrylate /N-vinylpyrrolidone) with a weight-average molecular weight of about 2500 having a vinyl group at one terminal end of the molecular chain. Copolymerization of 25 parts by weight of the macromonomer, 65 parts by weight of methyl methacrylate and 10 parts by weight of dimethylaminoethyl methacrylate was carried out in methyl isobutyl ketone (weight-average molecular weight: $6.5 \times 10^4$). Subsequently, to the polymer solution containing 100 parts by weight of the copolymer dissolved therein, 11 parts by weight of a partial urethane compound obtained by reacting hexamethylene diisocyanate and 2-hydroxyethyl acrylate such that the ratio of NCO group equivalent : OH group equivalent was 2.0: 1.1 was added to carry out the reaction, whereby 30% of the 3-chloro-2-hydroxypropyl methacrylate component was converted to the acrylic urethane to give a graft copolymerized polymer having photopolymerizable acrylic ester groups at the graft chains (this is called GP-3). The copolymerized polymer chain of methyl methacrylate and dimethylaminoethyl methacrylate constituting the main chain of the GP-3 has a glass transition point of 90° C.

Separately, 0.5 equivalents of methacrylic acid relative to the epoxy groups was added in the same manner as in Example 1 except for changing the Epikote 828 to Epikote 1001 with an epoxy equivalent of 450 (produced by Shell Chemical) to obtain a half-esterified epoxy resin (HE-2).

By use of the HE-2 and the above GP-3, an active energy ray-curing resin composition was prepared as follows.

| GP-3 | 100 parts by weight |
| HE-2 | 150 parts by weight |
| Dicyan diamide | 8 parts by weight |
| Irgacure 651 | 11 parts by weight |
| Crystal violet | 0.2 parts by weight |
| Methly isobutyl ketone | 300 parts by weight |

On a silicon wafer having an oxide film $SiO_2$ formed on the surface, the composition was applied by a bar coater to a thickness after drying of 50 μm. Next, a pattern for resolution test was formed in the same manner as in Example 1. The pattern formed was found to reproduce accurately the line/interval pattern of 50 μm width. Next, the silicon wafer was dried by heating and subjected to post-exposure by means of the same UV-ray light source as used in pattern exposure, followed by heating at 150° C. for 30 minutes. For the silicon wafer, the cross-cut tape peel-off test was practiced, whereby no peel-off of the tape was recognized at all.

Next, the silicon wafer was dipped in an NaOH aqueous solution of pH=9.0, and the pressure cooker test was practiced under the conditions of 121° C., 2 atm, and 10 hours. After completion of the test, the cross-cut tape peel-off test and the peel-off test at the pattern portion were practiced again. As a result, in either test no lowering in adhesiveness such as peel off, rising, etc., was seen at all.

EXAMPLE 4

A living polymer (N-butoxymethylacrylamide/2-hydroxyethylmethacrylate (=70/30 weight ratio) obtained by anion polymerization was allowed to react with acrylic acid chloride to obtain a macromonomer (acrylic acid poly-butoxymethylacrylamide/2-hydroxyethyl methacrylate) with a weight average molecular weight of about 3000 having a vinyl group at one terminal end of the molecular chain. Copolymerization of 25 parts by weight of the macromonomer, 70 parts by weight of methyl methacrylate and 5 parts by weight of acrylonitrile was carried out in methyl cellosolve to obtain a graft copolymerized polymer having heat crosslinkability with a weight-average molecular weight of $6.8 \times 10^4$ (this is called GP-4). The copolymerized polymer chain of methyl methacrylate and acrylonitrile constituting the main chain of the GP-4 has a glass transition point of 105° C.

By use of the thus obtained GP-4 and the HE-2 obtained in Example 3, an active energy ray-curing resin composition was prepared as follows.

| | |
|---|---|
| GP-4 | 100 parts by weight |
| HE-2 | 150 parts by weight |
| Copper phthalocyanine | 1 parts by weight |
| P-toluenesulfonic acid | 3 parts by weight |
| Triphenylsulfonium tetrafluoroborate | 10 parts by weight |
| Methyl cellosolve | 300 parts by weight |

On a Pyrex glass plate of 10 cm×10 cm, a 1% ethanolic solution of γ-mercaptopropyltrimethoxysilane, a silane coupling agent having thiol groups, was applied by a spinner. Coating was performed by the rotation at 2500 rpm for 25 seconds. Next, the glass plate was subjected to heat treatment at 120° C. for 10 minutes.

On the other hand, a mill dispersion of the above resin composition was applied on a 16 μm polyethyleneterephthalate film by a wire bar, followed by drying at 100° C. for 20 minutes, to form a resin composition layer with a film thickness of 10 μm.

As the next step, the film was laminated on the above Pyrex glass plate by means of a laminator HRL-24 (trade name, produced by Du Pont Co.) at 120° C. at a circumferential speed of 1 m/min. Following subsequently the same procedure as in Example 1, a sharp pattern colored in blue with lines and intervals of 25 microns was formed. Then, post-exposure under 10 J/cm$^2$ and heat treatment at 150° C. for 30 minutes were applied to effect complete curing.

The pattern formed was subjected to the pressure cooker test under the same conditions as in Example 1 for evaluation of adhesion property. The coating was not peeled off at all in the cross-cut cellotape peel-off test after the pressure cooker test.

Comparative Example 1

A thermoplastic linear polymeric compound with a weight average molecular weight of 8.8×10$^4$ was obtained by polymerization of methyl methacrylate, 2-hydroxyethyl methacrylate and butyl acrylate (=60/30/10 molar ratio) in methyl isobutyl ketone(this is called LP-1). By use of the LP-1, an active energy ray-curing resin composition having the following composition was prepared, and pattern formation was performed in entirely the same manner as in Example 1.

| | |
|---|---|
| LP-1 | 100 parts by weight |
| Triethylene glycol dimethacrylate | 50 parts by weight |
| Benzophenone | 10 parts by weight |
| Michler's ketone | 5 parts by weight |
| Crystal Violet | 0.3 parts by weight |
| Methyl cellosolve | 350 parts by weight |

The pattern obtained had substantially the same resolution as Example 1. However, in the pressure cooker test, peel-off of the pattern occurred before initiation of the peel-off test, thus exhibiting low water resistance and adhesiveness.

EXAMPLE 5

By use of the above GP-1, an active energy ray-curing resin composition was prepared as follows.

| | |
|---|---|
| GP-1 | 100 parts by weight |
| Trimethylolpropane triacrylate | 60 parts by weight |
| Epoxy ester 3002M *1 | 140 parts by weight |
| Benzophenone | 10 parts by weight |
| Michler's ketone | 5 parts by weight |
| Crystal violet | 0.3 parts by weight |
| Methyl cellosolve | 350 parts by weight |

*1 Methacrylic acid ester of the epoxy resin produced by Kyoei-sha Yushi Kagaku Kogyo K.K.

The composition was applied by use of a bar coater on a 10 cm×10 cm Pyrex substrate which had been subjected to ultrasonic cleaning treatment in a washing liquid Difron (produced by Daikin Kogyo K. K.) and dried to a thickness of about 50 μm after drying. On the surface of this composition was laminated a polyethyleneterephthalate film (Lumilar T type) with a thickness of 16 μm. Then, by use of a mask for resolution test, exposure was effected by means of an exposure light source for semiconductor, "Mask Alignment Device MA-10" (produced by Mikasa K. K.), using a ultra-high pressure mercury lamp with the center wavelength in the vicinity of 365 nm and a light energy of 12 mW/cm$^2$ at the irradiated surface for 20 seconds. After exposure, development was performed in the ultrasonic cleaner with the use of a developer of 1,1,1-trichloroethane for 45 seconds. The resolution of the resin composition after development was found to reproduce accurately the line/interval patterns with 50 μm widths.

Next, the substrate was dried by heating and post-exposure of 10 J/cm$^2$ was practiced. For the substrate, the cross-cut tape peel-off test was performed with the use of cellophane tape for industrial use. As a result, 100/100 adhesiveness was exhibited, with complete adhesion except for the clear scars of the crosscuts.

Also, the substrate was dipped in an NaOH aqueous solution of pH=9.0, and the pressure cooker test was performed under the conditions of 121° C., 2 atm, and 10 hours. After the pressure cooker test, the cross-cut tape peel-off test and the peel-off test at the 50 μm pattern portion were performed again. As a result, in either test no lowering in adhesiveness such as peel off, rising, etc., was observed at all. Also, no denaturation such as whitening of the coating was observed at all.

EXAMPLE 6

By use of GP-2, an active energy ray-curing resin composition was prepared as follows.

| | |
|---|---|
| GP-2 | 100 parts by weight |
| Neopentyl glycol diacrylate | 60 parts by weight |
| Epoxy ester 3002M | 140 parts by weight |
| Benzophenone | 10 parts by weight |
| Michler's ketone | 5 parts by weight |
| Crystal Violet | 0.3 parts by weight |
| Methyl cellosolve | 350 parts by weight |

By use of the composition, a pattern of 50 μm lines and intervals with a film thickness of 40 μm was formed on a 10 cm×10 cm$^2$ Pyrex substrate in the same manner as Example 5. After evaporation of developer and drying, post-exposure was effected by use of the same light source for 10 minutes. Subsequently, heat treatment was effected at 150° C. for 15 minutes.

The substrate having a cured pattern thus formed was dipped in an NaOH aqueous solution of pH=9.0, and the pressure cooker test was performed under the conditions of 121° C., 2 atm, and 20 hours. After completion of the test, the substrate was washed with water and dried and the cross-cut tape peel-off test and the peel-off test at the pattern portion were performed. As a result, 100/100 adhesion and no peel-off of the pattern were observed.

EXAMPLE 7

By use of GP-3, an active energy ray-curing resin composition was prepared as follows:

| GP-3 | 100 parts by weight |
| Trimethylolpropane triacrylate | 30 parts by weight |
| NK ester EPM 800 *2 | 100 parts by weight |
| Irgacure 651 | 11 parts by weight |
| Crystal Violet | 0.2 parts by weight |
| Methyl isobutyl ketone | 300 parts by weight |

*2 Methacrylic acid ester of epoxy resin produced by Shinnakamura Kagaku K.K.

On a silicon wafer having an $SiO_2$ oxide film formed on the surface, the above composition was applied by a bar coater to a thickness after drying of 50 μm. Next, a pattern for resolution test was formed in the same manner as in Example 1. The pattern formed was found to reproduce accurately the line/interval pattern of 50 μm width. Next, the silicon wafer was dried by heating and subjected to post-exposure under 10 $J/cm^2$ by means of the same UV-ray light source as used in pattern exposure.

For the silicon wafer, the cross-cut tape peel-off test was performed, whereby no peel-off of the tape was observed at all.

Next, the silicon wafer was dipped in an NaOH aqueous solution of pH=9.0, and the pressure cooker test was performed under the conditions of 121° C., 2 atm, and 20 hours. After completion of the test, the crosscut tape peel-off test and the peel-off test at the pattern portion were performed again. As a result, in either test no lowering in adhesiveness such as peel off, rising, etc., was observed at all.

EXAMPLE 8

By use of GP-4, an active energy ray-curing resin composition was prepared as follows.

| GP-4 | 100 parts by weight |
| Acrylic acid ester of triglycidyl ether of trimethylolpropane | 100 parts by weight |
| Urethane acrylate 11R4003 *3 | 100 parts by weight |
| Copper phthalocyanine | 15 parts by weight |
| P-toluenesulofnic acid | 3 parts by weight |
| Irgacure 651 | 15 parts by weight |
| Methyl cellosolve | 300 parts by weight |

*3 Urethane acrylate produced by Nagase Kasei K.K.

On a Pyrex glass plate of 10 cm×10 cm, a 1% ethanolic solution of γ-mercaptopropyltrimethoxysilane, a silane coupling agent having thiol groups, was applied by a spinner. Coating was performed under rotation at 2500 rpm for 25 seconds. Next, the glass plate was subjected to heat treatment at 120° C. for 10 minutes. A mill dispersion of the above resin composition was applied on a 16 μm polyethyleneterephthalate film by a wire bar, followed by drying at 100° C. for 20 minutes, to form a resin composition layer with a film thickness of 10 μm. As the next step, the film was laminated on the above Pyrex glass plate by means of a laminator HRL-24 (trade name, produced by Du Pont Co.) at 120° C. at a circumferential speed of 1 m/min. Following subsequently the same procedure as in Example 5, a sharp pattern colored in blue with lines and intervals of 25 microns was formed. Then, post-exposure under 10 $J/cm^2$ and heat treatment at 150° C. for 15 minutes were applied to effect complete curing.

The pattern formed was subjected to the pressure cooker test under the same conditions as in Example 5 for evaluation of adhesion property. The coating was not peeled off at all in the cross-cut cellotape peel-off test after the pressure cooker test.

Comparative example 2

An active energy ray-curing resin composition was prepared and pattern formation was conducted in entirely the same manner as in Example 5 except for using LP-1.

The pattern obtained had substantially the same resolution as in Example 5. However, in the pressure cooker test, peel-off of the pattern occurred before initiation of the peel-off test, thus exhibiting low water resistance and adhesiveness.

EXAMPLE 9

An amount of 250 g of Epicron 1050 (bisphenol type epoxy resin, epoxy equivalent 450–500, produced by Dainippon Ink Kagaku Kogyo K. K.) was melted at 70° C. in a flask and mixed with 0.5 g of hydroquinone (heat polymerization inhibitor) and 3 g of triethylbenzyl-ammonium chloride. To the mixture was added dropwise 20 g of acrylic acid under stirring over 30 minutes to carry out the reaction. After completion of the dropwise addition, stirring was continued at 80° C. for an additional 4 hours to complete the reaction. In this reaction, the mols of epoxy groups and mols of acrylic acid were set to become 10 : 5. By the above operation, a partially esterified product of Epicron 1050 with acrylic acid was obtained (this is called HE-1).

By use of GP-1 and the above HE-1, an active ray energy-curing resin composition was prepared as follows.

| GP-1 (graft copolymerized polymer) | 100 parts by weight |
| HE-1 (epoxy partial ester) | 100 parts by weight |
| Neopentylglycol diacrylate | 60 parts by weight |
| Benzophenone | 12 parts by weight |
| Michler's ketone | 6 parts by weight |
| Crystal Violet | 1 parts by weight |
| Methyl ethyl ketone/toluene (1/1 mixture) | 300 parts by weight |

The above composition was applied on a 16 μm Polyethyleneterephthalate film (Lumilar T type) by use of a bar coater to obtain a resin laminate film with a thickness after drying of about 50 μm. Drying was carried out in a hot air oven at 100° C. for 10 minutes. A copper-laminated plate for print wiring plate was polished with a brush and dried, and the above active energy ray-curable resin layer was laminated on the copper foil surface. Lamination was carried out by means of Hot Roll Laminator HRL-24 produced by E. I. DU Pont Co. at 105° C. at a circumferential speed of 1 m/min. After cooling of the substrate, exposure was effected by use of a negamask for resolution test with a baking light source which is highly parallel with a UV-ray energy of 12 $mW/cm^2$ in the vicinity of 365 nm for 45 seconds. After exposure, the mask film was removed and further the polyethyleneterephthalate film was peeled off, followed by spray development with 1,1,1-trichloroethane for 60 seconds. As a result, a pattern of 40 μm lines and intervals was found to be accurately formed on the substrate. The substrate was subjected to post-cure by means of a high pressure mercury lamp with a UV-ray energy of 80 mJ/cm$^2$ in the vicinity of 365 nm, and further to heat cure at 120° C. for 30 minutes. After the postcure, the pattern on the substrate was found to become a rigid coating film.

The substrate obtained was subjected to the cross-cut tape peel-off test, whereby high adhesion of 100/100 was exhibited.

Also, the above substrate was subjected to electrolytic plating in a copper sulfate plating solution of pH 1.2 at 45° C. for 30 minutes. For the substrate, the cross-cut tape peel-off test was conducted to obtain the result of 100/100, and no peel-off was observed at all even at the pattern portion which had acted as the resist film for copper sulfate plating, thus exhibiting high acid resistance.

The above substrate was also dipped in an aqueous NaOH solution of pH 12.0, equipped with electrodes and electrolytic cleaning was performed under the conditions of a voltage of 10 V and a current of 1A/dm$^2$ for 2 minutes. For the substrate, the cross-cut tape peel-off test was performed to obtain the result of 100/100, and no peel-off was observed at all even at the pattern portion which had acted as the resist film for electrolytic washing, thus exhibiting high alkali resistance.

The above substrate was also dipped in a soldering mixture at 260° C. composed of 60% Pb and 40% Sn for 15 seconds to apply solder plating at the exposed portion of the copper foil. For the substrate, the cross-cut tape peel-off test was performed to obtain the result of 100/100, and no peel-off was observed at all even at the pattern portion which had acted as the resist film for solder plating. Thus, it was found that the substrate exhibited satisfactory heat resistance as the solder resist.

EXAMPLE 10

Example 9 was repeated except for using 60 parts by weight of 2,2-bis[4-(acryloxydiethoxy)phenyl]propane in place of 60 parts by weight of neopentyl glycol diacrylate to obtain an active energy ray-curable resin composition.

By use of the resin composition, a pattern was formed on the substrate in entirely the same manner as in Example 9 and subjected to adhesion test according to the cross-cut tape peel-off test before and after the acid resistance, alkali resistance and solder resistance tests. As the results, excellent durability and adhesion strength were exhibited in all of the tests similarly as in Example 9.

EXAMPLE 11

Example 9 was repeated except for using 60 parts by weight of trimethylolpropane triacrylate in place of 60 parts by weight of neopentyl glycol diacrylate to obtain an active energy ray-curable resin composition.

By use of the resin composition, a pattern was formed on the substrate in entirely the same procedure as in Example 9 and subjected to adhesion test according to the cross-cut tape peel-off test before and after the acid resistance, alkali resistance and solder resistance tests. As the results, excellent durability and adhesion strength were exhibited in all of the tests similarly as in Example 9.

EXAMPLE 12

Example 9 was repeated except for using 60 parts by weight of Aronix M-8030 * 1 (trade name of polyester acrylate produced by Toa Gosei Kagaku K. K.) in place of 60 parts by weight of neopentyl glycol diacrylate to obtain an active energy ray-curable resin composition.

By use of the resin composition, a pattern was formed on the substrate in entirely the same manner as Example 9 and subjected to adhesion test according to the cross-cut tape peel-off test before and after the acid resistance, alkali resistance and solder resistance tests. As the results, excellent durability and adhesion strength were exhibited in all of the tests similarly as in Example 9.

EXAMPLE 13

According to the same procedure as in Example 9, by use of 250 g of Epicron N-665 (novolac type epoxy resin, epoxy equivalent of 200 to 230, produced by Dainippon Ink Kagaku Kogyo K. K.), acrylic acid was allowed to react therewith so that the mols of epoxy groups/mols of acrylic acid became 10/5. Thus, a partially esterified product of Epicron N-665 with acrylic acid was obtained (this is called HE-2 ).

By use of the graft copolymerized polymer GP-2 having heat crosslinkability and the partial acrylic acid esterified product HE-2, an active energy ray-curing resin composition was prepared as follows:

| | |
|---|---|
| GP-2 (graft copolymerized polymer) | 100 parts by weight |
| HE-2 (epoxy partial ester) | 80 parts by weight |
| Neopentyl glycol diacrylate | 60 parts by weight |
| Urethane acrylate *2 | 60 parts by weight |
| Benzophenone | 12 parts by weight |
| Michler's ketone | 6 parts by weight |
| Crystal Violet | 1 parts by weight |
| P-toluenesulfonic acid | 3 parts by weight |
| Methyl ethyl ketone/toluene (1/1 mixture) | 400 parts by weight |

*2 Urethane acrylate obtained by reacting PPG#400, isophorone diisocyanate and 2-hydroxyethyl acrylate at mols of OH groups of PPG#400:mols of OH groups of isophorone diisocyanate:mols of 2-hydroxyethyl acrylate = 2:4:2.

above composition was applied on a 16 μm polyethyleneterephthalate film (Lumilar T type) by a bar coater to obtain a resin laminate film with a thickness after drying of about 50 μm. Drying was carried out in a hot air oven at 100° C. for 10 minutes. A Pyrex glass substrate was subjected to ultrasonic cleaning with the use of "Difron" (detergent produced by Daikin Kogyo K. K.) and dried at 120° C. for 30 minutes. On the glass substrate was laminated the above resin laminate film according to the same method as in Example 9. Following subsequently the procedure as in Example 9, a relief pattern for resolution pattern was formed. A sharp pattern of 50 μm lines and intervals was found to be formed on the Pyrex glass substrate.

The substrate was applied with post-cure with the same intensity as in Example 9 and also with heat cure at 150° C. for 30 minutes. After the post-cure, the pattern on the substrate was found to become a rigid coating film.

The substrate obtained was subjected to the cross-cut tape peel-off test, whereby high adhesion of 100/100 was exhibited.

The above substrate was also subjected to the pressure cooker test by dipping in an aqueous HCl solution of pH 1.5 (2 atm., 121° C., 10 hours). Then, the cross-cut tape peel-off test was conducted to obtain the result that adhesion of 100/100 was maintained, thus exhibiting high acid resistance.

The above substrate was also subjected to the pressure cooker test by dipping in an aqueous NaOH solution of pH 10.0 (2 atm., 121° C., 10 hours). Then, the cross-cut tape peel-off test was conducted to obtain the result that adhesion of 100/100 was maintained, thus exhibiting high acid resistance.

EXAMPLE 14

Example 13 was repeated except for using 60 parts by weight of 2,2-bis 4-(acryloxydiethoxy)phenyl)propane in place of 60 parts by weight of neopentyl glycol diacrylate to obtain an active energy ray-curable resin composition.

By use of the resin composition, a pattern was formed on the substrate in entirely the same manner as Example 9 and subjected to adhesion test according to the cross-cut tape peel-off test before and after the pressure cooker tests under the acidic, alkaline conditions. As the results, excellent durability and adhesion strength were exhibited in all of the tests similarly as in Example 9.

Comparative Example 3

An active energy ray-curing resin composition was prepared and a pattern was formed in entirely the same manner as in Example 9 except for using LP-1 in place of GP-1.

The pattern obtained was found to have substantially the same resolution as in Example 9. However, when a boiling test was conducted in an aqueous NaOH solution of pH 9.0 for 4 hours, peel-off Of the pattern occurred from the substrate before initiation of the peel-off test, thus exhibiting low water resistance and adhesion.

As is apparent from the Examples and Comparative examples described above, the active energy ray-curing resin composition of the present invention can form a pattern of high resolution simultaneously with having high adhesion to the substrate, particularly considerably high adhesion when employing a graft copolymerized polymer having crosslinkability, and also has excellent mechanical strength as well as chemical resistance.

We claim:

1. An active energy ray-curing resin composition comprising: a component (i) and at least one of components (ii) and (iii), wherein the component (i) is a graft copolymerized polymer comprising a trunk chain composed of structural units derived from at least one monomer selected from the group consisting of $C_{1-4}$ alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinyl pyrrolidone or its derivatives, (E) vinylpyridine or its derivatives and (F) acrylamide derivatives represented by the following general formula I;

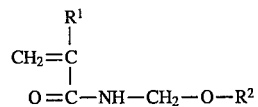
(I)

wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxyl groups, added to said trunk chain, said graft copolymerized polymer having a weight average molecular weight of about 5,000 to 300,000;

the component (ii) is a monomer having at least two ethylenically unsaturated bonds, said monomer having a minimum boiling point of 100° and selected from the group consisting of acrylic acid esters or methacrylic acid esters of polyfunctional epoxy resins having at least two epoxy groups in one molecule; acrylic acid esters or methacrylic acid esters of alkylene oxide addition products of polyhydric alcohols; polyester acrylates having an acrylic acid ester group at each terminal end of the molecular chains of polyesters having molecular weights of 500 to 3000 comprising dibasic acid and dihydric alcohol; and the reaction products between polyisocyanates and acrylic acid monomers having hydroxy groups; and the component (iii) is an epoxy resin comprising at least one compound having two or more epoxy groups in the molecule, wherein a part of the epoxy groups existing in said epoxy resin are esterified with an unsaturated carboxylic acid, said unsaturated carboxylic acid having an acrylic or methacrylic vinyl group on at least one terminal end of the molecule and a carboxyl group on the other terminal end of the molecule, and the esterification ratio of the epoxy group to the unsaturated carboxylic acid being in the range of 1:0.2 to 1:0.7, and said epoxy resin is selected from the group consisting of bisphenol A type epoxy resins, bisphenol S type epoxy resins and epoxy-urethane resins.

2. An active energy ray-curing resin composition according to claim 1, wherein the epoxy resin component (iii) is a resin in which an amount corresponding to 0.30 to 0.70 equivalents of epoxy group are esterified for each 1.0 equivalent of the epoxy groups existing in said epoxy resin.

3. An active energy ray-curing resin composition according to claim 1, comprising 20 to 80 parts by weight of the graft copolymerized polymer (i), and 80 to 20 parts by weight as the total amount of the monomer having an ethylenically unsaturated bond (ii) and the epoxy resin (iii), thereby imparting activation and chemical resistance properties to said composition, after curing.

4. An active energy ray-curing resin composition according to claim 1, wherein the ratio of the monomer having at least two ethylenically unsaturated bonds (ii) to the epoxy resin (iii) is 30:70 to 70:30, thereby imparting to the active energy ray-curing resin composition enhanced sensitivity to an active energy ray upon curing.

5. An active energy ray-curing resin composition according to claim 1, comprising 0.1 to 20 parts by weight of a radical polymerization initiator which can be activated by the action of an active energy ray formulated per 100 parts by weight of the total amount of the graft copolymerized polymer (i), the monomer having at least two ethylenically unsaturated bonds (ii) and the epoxy resin (iii).

6. An active energy ray-curing resin composition according to claim 1, comprising 0.2 to 15 parts by weight of an aromatic onium salt compound having photosensitivity containing an element belonging to the group VIa or the group Va of the periodic table formulated per 100 parts by weight of the total amount of the graft copolymerized polymer (i), the monomer having at least two ethylenically unsaturated bonds (ii) and the epoxy resin (iii).

7. An active energy ray-curing resin composition comprising: a component (i) and a component (ii), wherein the component (i) is a graft copolymerized polymer comprising a trunk chain composed of structural units derived from at least one monomer selected from the group consisting of $C_{1-4}$ alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinyl pyrrolidone or its derivatives, (E) vinylpyridine or its derivatives and (F) acrylamide derivatives represented by the following general formula I;

$$\begin{array}{c} R^1 \\ | \\ CH_2=C \\ | \\ O=C-NH-CH_2-O-R^2 \end{array} \quad (I)$$

wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxyl groups, added to said trunk chain, said graft copolymerized polymer having a weight average molecular weight of about 5,000 to 300,000; and the component (ii) is a monomer having at least two ethylenically unsaturated bonds, said monomer having a minimum boiling point of 100° C. and selected from the group consisting of acrylic acid esters or methacrylic acid esters of polyfunctional epoxy resins having at least two epoxy groups in one molecule; acrylic acid esters or methacrylic acid esters of alkylene oxide addition products of polyhydric alcohols; polyester acrylates having an acrylic acid ester group at each terminal end of the molecular chains of polyesters having molecular weights of 500 to 3000 comprising dibasic acid and dihydric alcohol; and the reaction products between polyisocyanates and acrylic acid monomers having hydroxy groups.

8. An active energy ray-curing resin composition according to claim 7, comprising 20 to 80 parts by weight of the graft copolymerized polymer (i) and 80 to 20 parts by weight of the monomer having at least two ethylenically unsaturated bonds (ii).

9. An active energy ray-curing resin composition according to claim 7, comprising 0.1 to 20 parts by weight of photopolymerization initiator per 100 parts by weight of the total amounts of the graft copolymerized polymer (i) and the monomer having at least two ethylenically unsaturated bonds (ii).

10. An active energy ray-curing resin composition comprising: a component (i) and a component (iii), wherein the component (i) is a graft copolymerized polymer comprising a trunk chain composed of structural units derived from at least one monomer selected from the group consisting of $C_{1-4}$ alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinyl pyrrolidone or its derivatives, (E) vinylpyridine or its derivatives and (F) acrylamide derivatives represented by the following general formula I;

$$\begin{array}{c} R^1 \\ | \\ CH_2=C \\ | \\ O=C-NH-CH_2-O-R^2 \end{array} \quad (I)$$

wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have one or more hydroxyl groups, added to said trunk chain said graft copolymerized polymer having a weight average molecular weight of about 5,000 to 300,000; and the component (iii) is an epoxy resin comprising at least one compound having two or more epoxy groups in the molecule, wherein a part of the epoxy groups existing in said epoxy resin are esterified with an unsaturated carboxylic acid, said unsaturated carboxylic acid having an acrylic or methacrylic vinyl group on at least one terminal end of the molecule and a carboxyl group on the other terminal end of the molecule, and the esterification ratio of the epoxy group to the unsaturated carboxylic acid being in the range of 1:0.2 to 1:0.7, and said epoxy resin is selected from the group consisting of bisphenol A type epoxy resins, bisphenol S type epoxy resins and epoxy-urethane resins.

11. An active energy ray-curing resin composition according to claim 10, wherein the component (iii) is a resin in which an amount corresponding to 0.45 to 0.55 equivalent of 1.0 equivalent of the epoxy groups existing in said epoxy resin is esterified.

12. An active energy ray-curing resin composition according to claim 10, comprising 20 to 80 parts by weight of the graft copolymerized polymer (i) and 80 to 20 parts by weight of the resin (iii).

13. An active energy ray-curing resin composition according to claim 10, comprising 0.1 to 20 parts by weight of a radical polymerization initiator which can be activated by the action of an active energy ray formulated per 100 parts by weight of the total amount of the graft copolymerized polymer (i) and the epoxy resin (iii).

14. An active energy ray-curing resin composition according to claim 10, comprising 0.2 to 15 parts by weight of an aromatic onium salt compound having photosensitivity containing an element belonging to the group VIa or the group Va of the periodic table formulated per 100 parts by weight of the total amount of the graft copolymerized polymer (i) and the epoxy resin (iii).

* * * * *

UNITED STATES PATENT AND TRADEMARK OFFICE
CERTIFICATE OF CORRECTION

PATENT NO. : 5,585,221

DATED : December 17, 1996

INVENTOR(S): HIROMICHI NOGUCHI ET AL.　　　　　　Page 1 of 4

It is certified that error appears in the above-identified patent and that said Letters Patent is hereby corrected as shown below:

Title page,
[75] INVENTORS:

Line 3, "Atugi" should read --Atsugi,--.

[56] REFERENCES CITED

U.S. Patent Documents, "Inata" should read --Iwata--.

COLUMN 1

Line 37, "utilized" should read --utilized in--.

COLUMN 2

Line 24, "vinyl-pyridine" should read --vinylpyridine--.
Line 35, "group.)," should read --group),--.
Line 49, "Of" should read --of--.

COLUMN 3

Line 47, "monomer" should read --a monomer--.

COLUMN 5

Lines 44-45, "having　　　　　　　　urethane" should read --having urethane--.

COLUMN 6

Line 28, "monomers-having" should read --monomers having--.

UNITED STATES PATENT AND TRADEMARK OFFICE
CERTIFICATE OF CORRECTION

PATENT NO. : 5,585,221

DATED : December 17, 1996

INVENTOR(S): HIROMICHI NOGUCHI ET AL.

It is certified that error appears in the above-identified patent and that said Letters Patent is hereby corrected as shown below:

COLUMN 9

Line 65, "benzil" should read --benzoin--.

COLUMN 10

Line 34, "or the" should read --or--.
    Line 51, "to the" should read --to--.
    Line 53, "to the" should read --to--.

COLUMN 13

Line 54, "with" should be deleted.

COLUMN 14

Line 51, "complexs" should read --complexes--.
    Line 56, "imparting water proofness" should read --imparting of water-proofness,--

COLUMN 16

Line 47, "a" should read --an--.

COLUMN 20

Line 18, "a" should read --an--.

UNITED STATES PATENT AND TRADEMARK OFFICE
CERTIFICATE OF CORRECTION

PATENT NO. : 5,585,221

DATED : December 17, 1996

INVENTOR(S) : HIROMICHI NOGUCHI ET AL.

It is certified that error appears in the above-identified patent and that said Letters Patent is hereby corrected as shown below:

COLUMN 21

Line 51, "P-toluenesulofnic" should read --P-toluenesulfonic--.

COLUMN 22

Line 13, "example" should read --Example--.
    Line 51, "Polyeth-" should read --polyeth- --.
    Line 60, "DU" should read --Du--.

COLUMN 24

Line 41, "above" should read --The above--.

UNITED STATES PATENT AND TRADEMARK OFFICE
CERTIFICATE OF CORRECTION

PATENT NO. : 5,585,221

DATED : December 17, 1996

INVENTOR(S): HIROMICHI NOGUCHI ET AL.

It is certified that error appears in the above-identified patent and that said Letters Patent is hereby corrected as shown below:

<u>COLUMN 25</u>

Line 29, "Of" should read --of--.

Signed and Sealed this

Twenty-sixth Day of August, 1997

Attest:

BRUCE LEHMAN

*Attesting Officer*      *Commissioner of Patents and Trademarks*